(12) United States Patent
Renken (10) Patent No.: US 7,819,033 B2
(45) Date of Patent: Oct. 26, 2010

(54) PROCESS CONDITION SENSING WAFER AND DATA ANALYSIS SYSTEM

(76) Inventor: Wayne G. Renken, 5928 Kyburz Pl., San Jose, CA (US) 95102

( * ) Notice: Subject to any disclaimer, the term of this patent is extended or adjusted under 35 U.S.C. 154(b) by 63 days.

(21) Appl. No.: 12/106,998

(22) Filed: Apr. 21, 2008

(65) Prior Publication Data

US 2008/0228419 A1   Sep. 18, 2008

(51) Int. Cl.
  *G01D 7/02*   (2006.01)
(52) U.S. Cl. ..................................................... 73/866.1
(58) Field of Classification Search ................ 73/866.1, 73/865.6
  See application file for complete search history.

(56) References Cited

U.S. PATENT DOCUMENTS

| | | | |
|---|---|---|---|
| 3,589,979 A | 6/1971 | Finch et al. |
| RE32,369 E | 3/1987 | Stockton et al. |
| 4,656,454 A | 4/1987 | Rosenberger |
| 4,680,569 A | 7/1987 | Yamaki et al. |
| 5,001,934 A | 3/1991 | Tuckey |
| 5,184,107 A | 2/1993 | Maurer |
| 5,262,944 A | 11/1993 | Weisner et al. |
| 5,341,684 A | 8/1994 | Adams et al. |
| 5,435,646 A | 7/1995 | McArthur |
| 5,444,637 A | 8/1995 | Smesny et al. |
| 5,479,197 A | 12/1995 | Fujikawa et al. |
| 5,564,889 A | 10/1996 | Araki |
| 5,629,538 A | 5/1997 | Lipphardt et al. |
| 5,669,713 A | 9/1997 | Schwartz et al. |
| 5,790,151 A | 8/1998 | Mills |
| 5,895,859 A | 4/1999 | Sawada et al. |
| 5,969,639 A | 10/1999 | Lauf et al. |
| 5,970,313 A | 10/1999 | Rowland et al. |
| 6,010,538 A | 1/2000 | Sun et al. |
| 6,033,922 A | 3/2000 | Rowland et al. |
| 6,075,909 A | 6/2000 | Ressl |
| 6,100,506 A | 8/2000 | Colelli, Jr. et al. |
| 6,164,132 A | 12/2000 | Matuleck |

(Continued)

FOREIGN PATENT DOCUMENTS

EP    0539804    5/1993

(Continued)

OTHER PUBLICATIONS

Baker et al.; "A Novel In Situ Monitoring Technique for Reactive Ion Etching Using a Surface Micromachined Sensor," IEEE Transactions on Semiconductor Manufacturing, vol. 11, No. 2, May 1998, pp. 254-264.

(Continued)

*Primary Examiner*—John Fitzgerald
(74) *Attorney, Agent, or Firm*—Joshua D. Isenberg; JDI Patent (57) ABSTRACT

A measuring device incorporating a substrate with sensors that measure the processing conditions that a wafer may undergo during manufacturing. The substrate can be inserted into a processing chamber by a robot head and the measuring device can transmit the conditions in real time or store the conditions for subsequent analysis. Sensitive electronic components of the device can be distanced or isolated from the most deleterious processing conditions in order increase the accuracy, operating range, and reliability of the device.

15 Claims, 9 Drawing Sheets

U.S. PATENT DOCUMENTS

| | | | |
|---|---|---|---|
| 6,190,040 | B1 | 2/2001 | Renken et al. |
| 6,201,467 | B1 | 3/2001 | Winterer et al. |
| 6,273,544 | B1 | 8/2001 | Silverbrook |
| 6,313,903 | B1 | 11/2001 | Ogata |
| 6,325,536 | B1 | 12/2001 | Renken et al. |
| 6,378,378 | B1 | 4/2002 | Fisher |
| 6,472,240 | B2 | 10/2002 | Akram et al. |
| 6,477,447 | B1 | 11/2002 | Lin |
| 6,542,835 | B2 | 4/2003 | Mundt |
| 6,553,277 | B1 | 4/2003 | Yagisawa et al. |
| 6,590,777 | B2 | 7/2003 | Morino et al. |
| 6,651,488 | B2 | 11/2003 | Larson, III et al. |
| 6,655,835 | B2 | 12/2003 | Mattoon et al. |
| 6,671,660 | B2 | 12/2003 | Freed |
| 6,677,166 | B2 | 1/2004 | Hunter |
| 6,691,068 | B1 | 2/2004 | Freed |
| 6,734,027 | B2 | 5/2004 | Jonkers |
| 6,738,722 | B2 | 5/2004 | Poolla et al. |
| 6,741,945 | B2 | 5/2004 | Poolla et al. |
| 6,759,253 | B2 | 7/2004 | Usui et al. |
| 6,789,034 | B2 | 9/2004 | Freed |
| 6,889,568 | B2 | 5/2005 | Renken |
| 6,895,831 | B2 * | 5/2005 | Hunter ...................... 73/865.9 |
| 6,915,589 | B2 | 7/2005 | Sun et al. |
| 6,966,235 | B1 | 11/2005 | Paton |
| 6,971,036 | B2 | 11/2005 | Freed |
| 6,995,691 | B2 | 2/2006 | Parsons |
| 7,005,644 | B2 | 2/2006 | Ishikawa et al. |
| 7,135,852 | B2 | 11/2006 | Renken et al. |
| 7,151,366 | B2 * | 12/2006 | Renken et al. ........... 324/158.1 |
| 7,331,250 | B2 * | 2/2008 | Hunter ...................... 73/865.9 |
| 7,360,463 | B2 * | 4/2008 | Renken ..................... 73/866.1 |
| 7,385,199 | B2 | 6/2008 | DeWames et al. |
| 7,434,485 | B2 * | 10/2008 | Hunter ...................... 73/865.9 |
| 2001/0002119 | A1 | 5/2001 | Winterer et al. |
| 2001/0012639 | A1 | 8/2001 | Akram et al. |
| 2004/0031340 | A1 * | 2/2004 | Renken ..................... 73/866.1 |
| 2004/0074323 | A1 | 4/2004 | Renken |
| 2006/0174720 | A1 | 8/2006 | Renken et al. |

FOREIGN PATENT DOCUMENTS

| | | |
|---|---|---|
| EP | 0563713 | 10/1993 |
| EP | 0764977 | 3/1997 |
| EP | 0865922 | 9/1998 |
| EP | 1014437 A2 | 6/2000 |
| GB | 2086807 A1 | 5/1982 |
| WO | WO00/68986 | 11/2000 |
| WO | WO02/17030 A2 | 2/2002 |
| WO | WO02/17030 A3 | 2/2002 |
| WO | WO 03/067183 | 8/2003 |

OTHER PUBLICATIONS

U.S. Appl. No. 60/285,613, filed Apr. 19, 2001; Freed et al.; "Firmware, Methods, Apparatus, and Computer Program Products for Wafer Sensors".

U.S. Appl. No. 60/285,439, filed Apr. 19, 2001; Freed et al.; "Methods Apparatus, and Computer Program Products for Obtaining Data for Process Operation, Optimization, Monitoring, and Control".

Freed et al.; "Autonomous On-Wafer Sensors for Process Modeling, Diagnosis, and Control," IEEE Transactions on Semiconductor Manufacturing, vol. 14, No. 3, Aug. 2001, pp. 255-264.

Freed; "Wafer-Mounted Sensor Arrays for Plasma Etch Processes", Dissertation, Univ. of CA. Berkeley, Fall 2001.

International Search Report, corresponding to PCT/US03/00751, Aug. 1, 2003, 3 pages.

"Notification of Transmittal of the International Search Report or the Declaration", corresponding PCT application No. PCT/US03/00751, International Searching Authority, European Patent Office, Jun. 8, 2003, 7 pages.

PTO, "Office Action," corresponding U.S. Appl. No. 10/685,550, Sep. 25, 2006, 18 pages.

Rubitherm GmbH, "Rubitherm® RT, Phase Change Material based on n-Paraffins and Waxes," Innovative PCM's and Thermal Technology, Rubitherm Phase Change Material, Version: Jun. 15, 2004, 2 pages.

Unsolicited e-mail from Steve Maxwell at steve_maxwell60@yahoo.com to info@phdr-law.com, dated Jan. 3, 2006, 1 page.

Office Action dated Jan. 25, 2010 issued for Korean Patent Application No. 2004-7011508.

Office Action dated Oct. 20, 2009 issued for Japanese Patent Application No. 2003-563004.

Final Office Action dated Mar. 29, 2007 for U.S. Appl. No. 10/685,550.

Notice of Allowance dated Dec. 17, 2007 for U.S. Appl. No. 10/685,550.

Notice of Allowance dated Sep. 7, 2004 for U.S. Appl. No. 10/056,906.

Office Action dated Aug. 22, 2007 of U.S. Appl. No. 10/685,550.

Office Action dated Jun. 18, 2003 for U.S. Appl. No. 10/056,906.

Final Office Action Dated Jan. 12, 2004 for U.S. Appl. No. 10/056,906.

Office Action dated Jun. 29, 2004 for U.S. Appl. No. 10/685,550.

Final Office Action dated Mar. 16, 2006 for U.S. Appl. No. 10/685,550.

Notice of Allowance and Fee(s) due dated Dec. 14, 2009 issued for U.S. Appl. No. 11/302,763.

U.S. Appl. No. 12/690,882, filed Jan. 20, 2010.

Office Action dated Jun. 25, 2008 issued for U.S. Appl. No. 11/302,763.

Final Office Action dated Jan. 14, 2009 issued for U.S. Appl. No. 11/302,763.

Office Action dated Jun. 4, 2009 issued for U.S. Appl. No. 11/302,763.

Notice of Allowance and Fee(s) Due dated Mar. 22, 2010 issued for U.S. Appl. No. 11/302,763.

U.S. Appl. No. 12/787,326, filed May 25, 2010.

* cited by examiner

PROCESS CONDITION SENSING WAFER AND DATA ANALYSIS SYSTEM

BACKGROUND OF THE INVENTION

1. Field of the Invention

The present invention relates to a semiconductor wafer processing, LCD display glass substrate processing, magnetic memory disc processing and other devices fabricated from thin film processes and more specifically to a substrate which can sense and transmit processing conditions.

2. Discussion of the Related Art

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum pressure, chemical gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and thus the performance of the integrated circuit. Using a substrate to measure the processing conditions that is of the same or similar material as the integrated circuit or other device provides the most accurate measure of the conditions because the thermal conductivity of the substrate is the same as the actual circuits that will be processed. Gradients and variations exist throughout the chamber for virtually all process conditions. These gradients therefore also exist across the surface of a substrate. In order to precisely control processing conditions at the wafer, it is critical that measurements be taken upon the wafer and the readings be available in real time to an automated control system or operator so that the optimization of the chamber processing conditions can be readily achieved. Processing conditions include any parameter used to control semiconductor or other device manufacture or any condition a manufacturer would desire to monitor.

Within the processing chamber a robot head transports the test wafer or substrate. One example of a device incorporating a robot head is manufactured by the TEL Corporation. The robot head can pivot. The robot head also incorporates multiple levels or hands. A first level or hand can extend out and a second level or hand can further extend out carrying a wafer. A second robot or moving platform can receive the wafer and extend it to a third holder which lowers it into the process chamber. For more information about the robot head and processing chamber, please refer to U.S. Pat. No. 5,564,889 to Araki, entitled "Semiconductor Treatment System and Method for Exchanging and Treating Substrate," which is hereby incorporated by this reference in its entirety.

SUMMARY OF THE INVENTION

Placement of sensors directly upon or in the substrate and spaced throughout the substrate surface yields an accurate gradient reading of various processing conditions upon the surface of the wafer. The processing conditions may be stored in memory for later evaluation or are available in real time to be read via a remote data processing device such as a computer, PDA or any other microprocessor controlled device that can present information and receive input from a control system or operator. The operator can monitor the processing conditions in real time, and then alter the settings of the processing chamber to reach an ideal state while continuing to monitor the effects, or this may be accomplished by an automated optimization and control system. Additionally, subsequent processing steps can be instantaneously modified based on a process condition of a prior step.

Distancing sensitive electronic circuitry from the processing conditions results in a wider operating range and more accurate, reliable, repeatable and drift-free operation.

DETAILED DESCRIPTION OF THE INVENTION

The measurement system of the present invention measures processing conditions in various locations of a wafer or substrate and transmits them in real time to a data processing device or records them in memory for later transmission or downloading of process conditions.

As defined herein, "processing conditions" refer to various processing parameters used in manufacturing an integrated circuit. Processing conditions include any parameter used to control semiconductor manufacture or any condition a manufacturer would desire to monitor such as but not limited to temperature, processing chamber pressure, gas flow rate within the chamber, gaseous chemical composition within the chamber, ion current density, ion current energy, light energy density, and vibration and acceleration of the wafer.

The invention will now be described with reference to the figures.

Figure 1A:
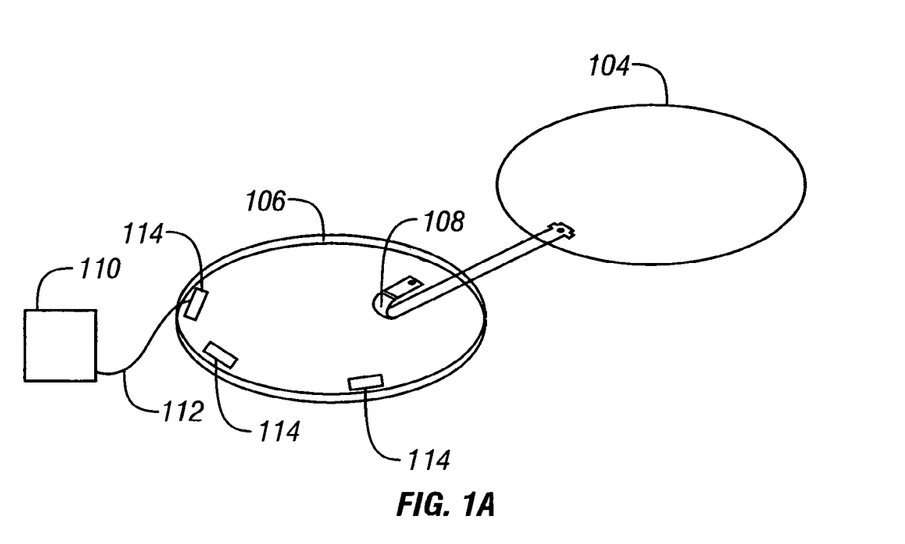
FIG. 1A is a perspective view of PCMD 100, a first embodiment of the invention, in an extended state.

FIG. 1A illustrates processing condition measuring device ("PCMD") 100, a first embodiment of the invention, in an extended position. PCMD 100 has two principal pieces, substrate 104 and electronics disc 106. The substrate 104 is used to measure the processing conditions of semiconductor manufacturing equipment, glass substrate processing equipment, and magnetic memory disc processing equipment. Specifically, it is used to measure the conditions that a wafer or substrate undergoes during processing. Sensors are arranged in different areas on the surface or within substrate 104 in order to measure the processing conditions across the substrate. By measuring in different areas of the substrate, the gradient across the substrate can be calculated, and additionally, the condition at a particular location of the substrate can be correlated to the resultant characteristics of the substrate. The number of sensors in/on substrate 104 will vary upon the processing condition being measured and the size of substrate 104. In one embodiment for measuring temperature, a 200 mm diameter substrate has 17 sensors whereas a 300 mm diameter substrate has 29 sensors. Substrate 104 will be discussed later in more detail with regard to FIGS. 1G-1H.

Electronics disc 106 is connected to substrate 104 by cable 108. Cable 108 can be any type of cable but is preferably a flat ribbon type cable that is flexible and has a low profile. The processing conditions that PCMD will be subjected to often involve high or variable temperatures or other conditions, both of which negatively affect the functionality, accuracy, and reliability of electronic components. Furthermore, numerous other processing steps and conditions make it advantageous to distance the electronics from the process or even to locate the electronics outside of the processing environment. Separating the PCMD into two pieces, in this embodiment, allows the substrate and the sensors to be inside of the processing chamber while the electronics can remain outside of the chamber free from the deleterious effects of the elevated temperature and the other various processing conditions. Cable 108 of PCMD 100 thus may pass from the exterior to the interior of the processing chamber under a chamber seal to allow the process to proceed without risk of leakage of the process atmosphere to or from the exterior environment. The cable is preferably made of a material resistant to temperature and other gaseous chemicals used in the manufacturing process such as polyimide.

Data processing device ("DPD") 110 is connected to electronics disc 106 with telecommunications link 112 at data port 114. Telecommunications link 112 may be a wired or wireless link and will be described later in further detail with regard to FIG. 1F.

Figure 1B:
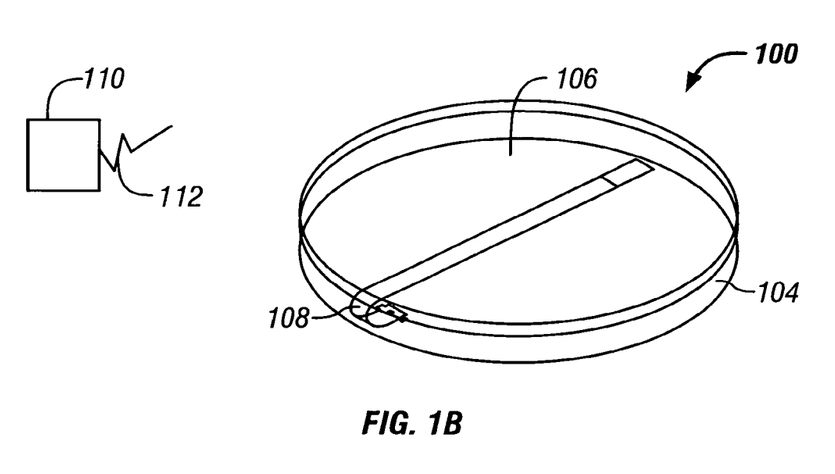
FIG. 1B is a perspective view of PCMD 100 in a concentric state.

FIG. 1B shows substrate 104 and electronics disc 106 concentrically located with cable 108 between them. Concentric is hereby defined as the circumference of one circle being within the circumference of another circle, the circles not necessarily having the same center. Thus, this definition also encompasses eccentricity of the circles.

Figure 1C:
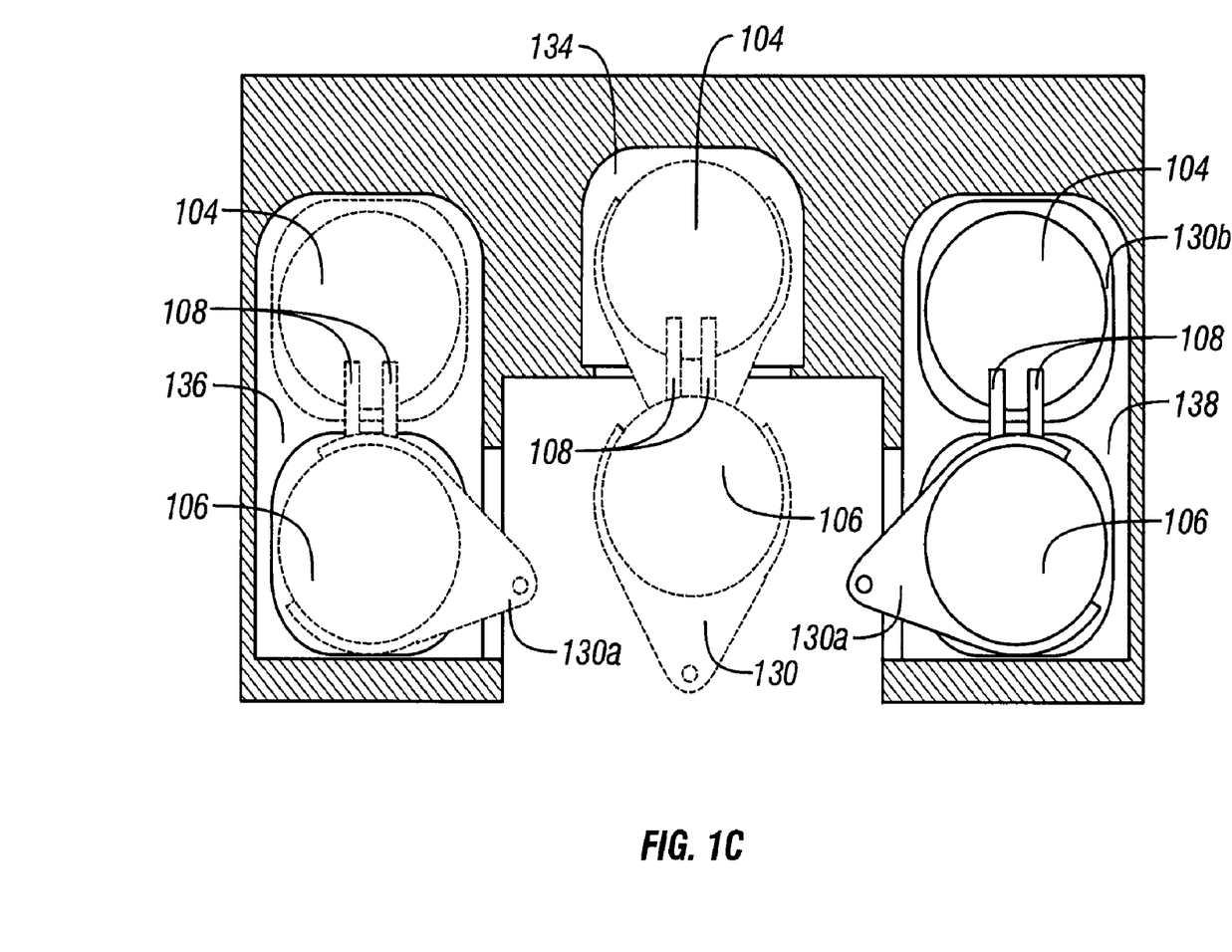
FIG. 1C is a top view of a processing chamber and robot hand.
Figure 1D:
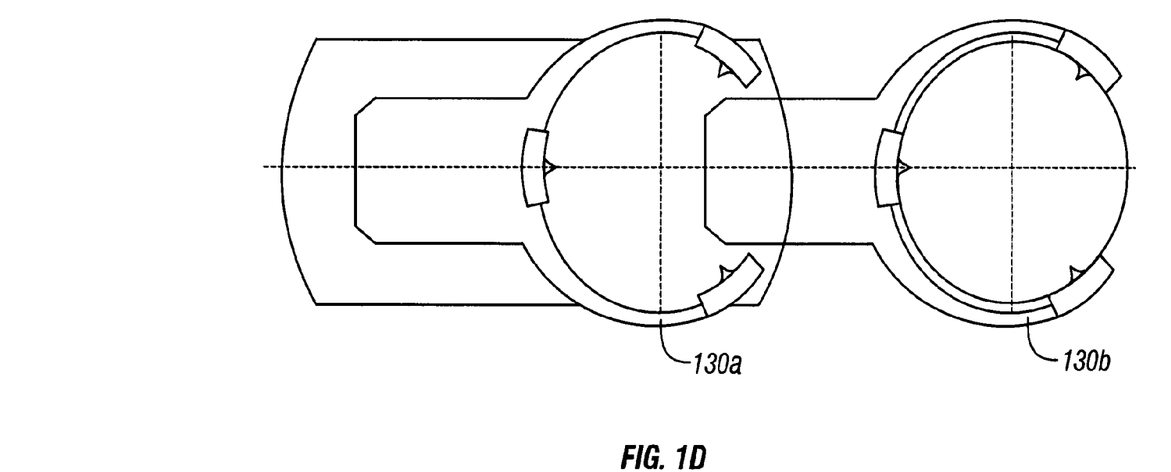
FIG. 1D is a top view of a robot hand extending.
Figure 1E:
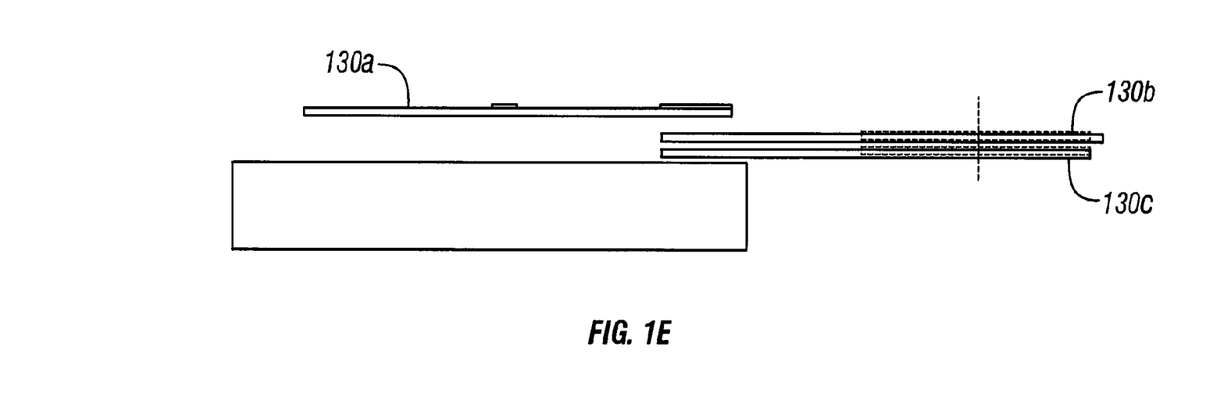
FIG. 1E is a plan view of a robot hand extending.

Concentrically located, they can be loaded into two robot arms spaced one above the other. The substrate 104 with the sensors would be held by the lower robot arm. The lower arm may be extended for insertion of the substrate 104 into a processing chamber. The processing chamber has three areas for insertion: area 134, area 136, and area 138. FIG. 1C illustrates a robot head 130 inserting PCMD 100 into various areas of a processing chamber 132. Robot hands 130a (above, holding the electronics disc 106) and robot hand 130b (below, holding the substrate 104) are both capable of independently extending. FIGS. 1D and 1E illustrate three hands 130a, 130b, and 130c of robot head 130. In FIG. 1D, level robot hand 130b is extended away from robot hand 130a of robot hand 130. Level 130b or 130c would contain substrate 104, and level 130a or 130b, respectively, would contain electronics disc 106 when PCMD 100 is in its extended state. The robot head 130 would first have PCMD in its concentric state as seen in FIG. 1B as it approaches the chamber. Robot hand 130b would then extend away from hand 130a and thus separate substrate 104 from electronics disc 106. In this way, substrate 104 can be placed into area 134 as seen in FIG. 1C. If PCMD were to be placed into area 136, robot hands 130a and 130b would be inserted into area 136 with PCMD 100 in its concentric state. The substrate 104 would be lowered onto a sliding platform which would move substrate 104 to the process chamber at position 136. Prior to loading into robot hands 130a and 130b, PCMD 100 would be rotated to a proper orientation so that it could be extended along the axis of cable 108. Placement of substrate 104 into process chamber 138 would be substantially the same as for chamber 136 except for a different rotation angle to allow the extension along the axis of cable 108 to be in line with chamber 138.

Figure 1F:
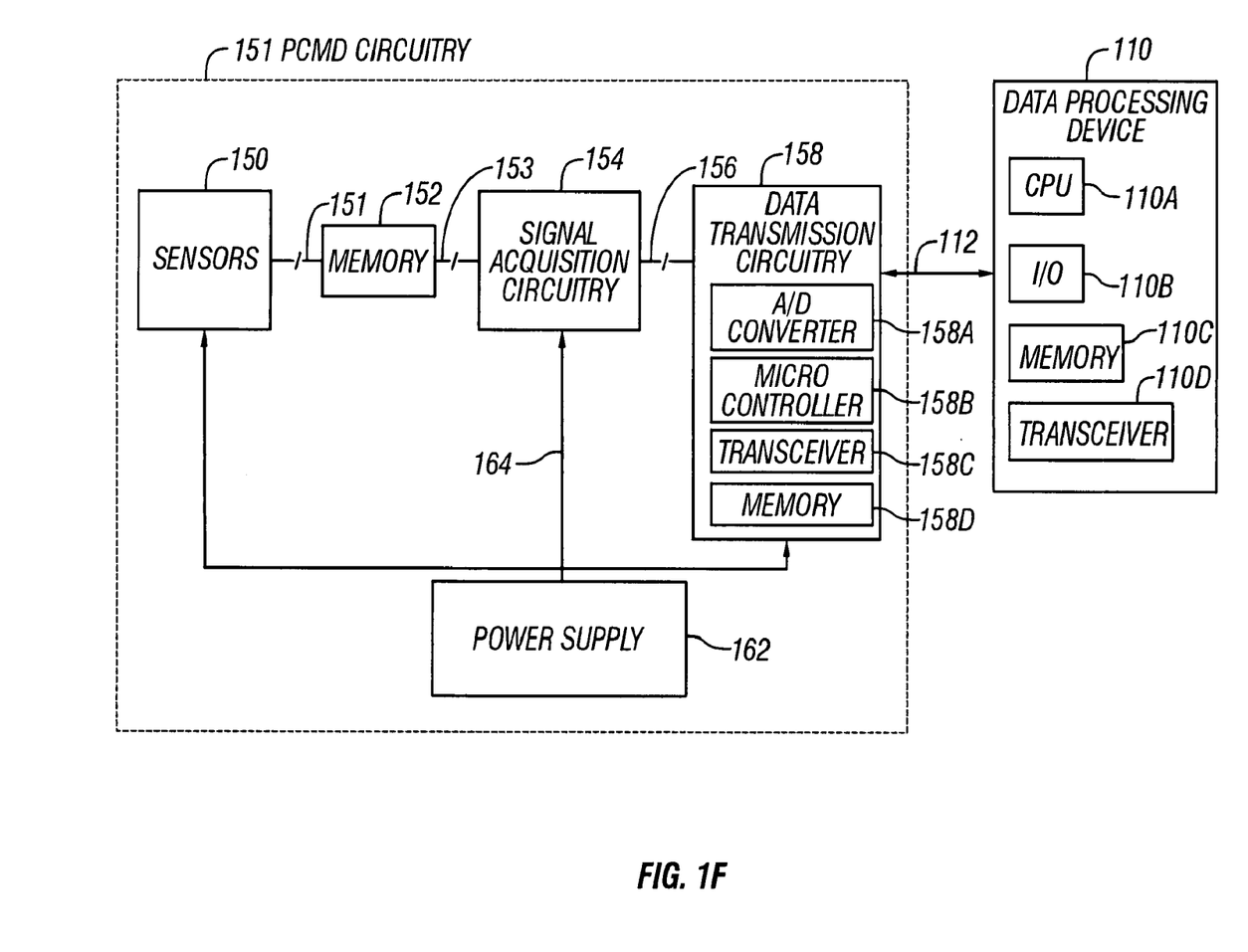
FIG. 1F is a schematic of the electronics and circuitry common to all embodiments.

FIG. 1F is a block diagram illustrating the electrical circuits and signal flow of PCMD circuitry 151 and DPD 110, which is common to all the embodiments of the invention. Sensors 150, as mentioned previously, are in or on substrate 104. The output of sensors 150 is coupled to SAC 154 via conductors 153. Memory 152 is optional and is preferably located near sensors 150 either on substrate 104 or on a connector of cable 108. Memory 152, if present, stores digital sensor data which is passed through SAC 154 without processing and continues through conductors 156 to DTC 158 for reading of the digital sensor data by the micro-controller 158B. Memory 152 may contain calibration coefficients for the sensors 150. In this way, even if the electronics disc 106 is changed, memory 152 and the calibration coefficients will remain with the appropriate sensors 150. SAC 154 is preferably located at electronics disc 106 but may be located at substrate 104 or anywhere within or external of the process chamber. SAC 154 contains the circuitry necessary to pick up the sensor outputs and if necessary provide any input power or other signals needed to drive the sensors such as amplifiers, current sources, and filters. SAC 154 drives the signal to data transmission circuitry ("DTC") 158 over conductors 156. Power supply 162 can be a storage cell, radiative energy conversion cell, or inductive coupled power source and powers all the components of PCMD 100 via electrical bus 164.

DTC 158 comprises the circuitry necessary to process, store and transmit the signals in analog or digital form from SAC 154 to DPD 110 over data link 112. In the case that the signals are sent digitally, DTC 158 may include one or more analog to digital converters 158A. A transceiver 158C within DTC 158 sends and receives the measured processing conditions and any control signals to and from transceiver 110d of DPD 110. Although transceiver 110d is shown as part of DPD 110, it may also be remotely located on robot head 130. DTC 158 may also contain calibration coefficients for the sensors 150. DTC 158 may read the calibration coefficient information and communicate it to data processing device 110 for applying the calibration correction to the measured data. DTC 158 may also optionally contain memory 158D to store the recorded processing conditions as measured by sensors 150 in the raw or corrected state, as well as other information such as the calibration coefficients. Microcontroller or gate array 158B manages the processes of DTC 158. Data link 112 may be a wireless link or may be a multi conductor data cable such as an RS 232 or universal serial bus (USB) connection. In the case that data link 112 is wireless, the transceivers 158c and 110d can communicate with infrared, acoustic, sonic, ultrasonic, or radio frequency signals. Any number of well-known protocols may be employed such as Bluetooth. The transceiver may also send and receive signals inductively. In PCMD 100, DTC 158 is a part of electronics disc 106, whereas in the following embodiments it may be located elsewhere. For clarity, interconnects or wiring within SAC 154, DTC 158 and DPD 110 have not been shown.

Data processing device 110 can be any microprocessor or gate array controlled device such as a computer or a personal digital assistant ("PDA") or a purpose built computer. DPD 110 includes a central processing unit 110A and may also include input/output devices 110B such as a display or keyboard, mouse etc. . . . , memory 110C and transceiver 110D.

Figure 1G:
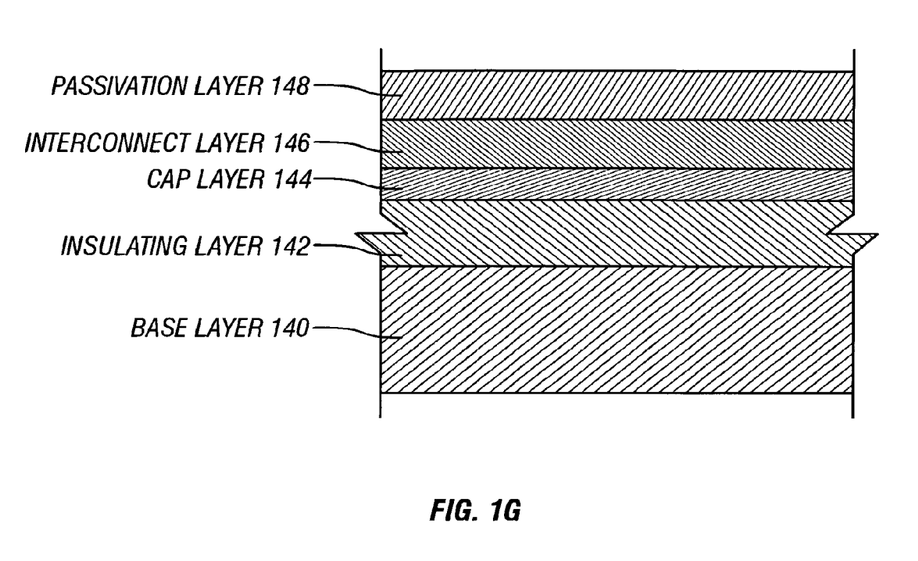
FIG. 1G is a cross section of substrate 104.

Substrate 104 has a base layer 140 that is preferably a silicon wafer, but can also be made out of numerous other materials that may be used in manufacturing integrated circuits or thin film devices including glass, ceramic, GaAs, carbide or nitride. Substrate 104 and electronics disc 106 are preferably 200 mm or 300 mm in diameter to simulate the size of current wafers and in order to be handled by conventional wafer handling machinery; however, they may be of any diameter or any shape.

Figure 1H:
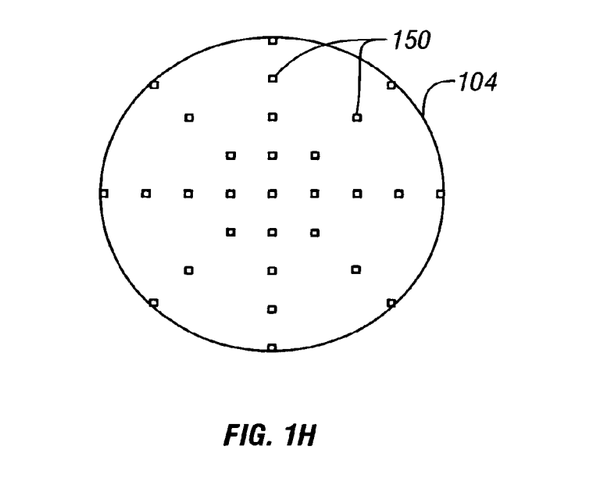
FIG. 1H is a top view of substrate 104.
Figure 1J:
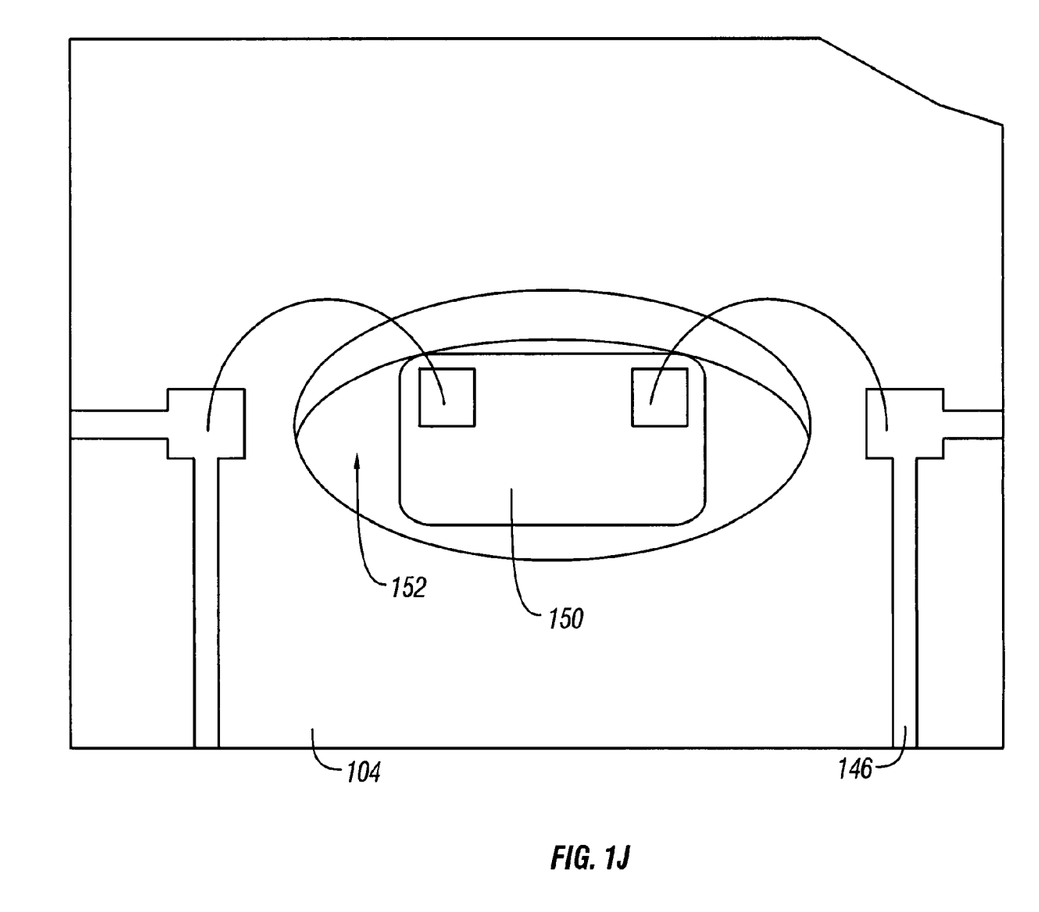
FIG. 1J is a perspective view of a sensor in substrate 104.

FIG. 1G is a cross section of substrate 104. In this illustrative example, base layer 140 is a silicon wafer with various layers formed upon the wafer. Base layer 140 has an insulating layer 142 upon base layer 140. Insulating layer 142 can be any insulative material but is preferably a thermal oxide such as silicon dioxide. A cap layer 144 is then formed on the top of insulating layer 142. Cap layer 144 compensates for any defects in insulating layer 142. Upon cap layer 144 is interconnect layer 146. Interconnect layer 146 is a conductive layer that is used to transfer the signals to and from the sensors monitoring the process conditions. Interconnect layer 146 is etched to form circuit traces leading to and from the precise location of the sensors, and any bond pads needed for interconnection. Additionally, the sensors themselves may be formed within interconnect layer 146, and within other conductive layers (not shown). Upon interconnect layer 146 is passivation layer 148. Passivation layer 148 is preferably a nitride layer but can be any type of dielectric material. FIG. 1H illustrates the preferred layout of sensors 150 on/in substrate 104, although many different layouts are possible and within the scope of the invention. FIG. 1J illustrates a discrete sensor 150 mounted in substrate 104 and connected to circuit traces formed in interconnect layer 146. A thermally conductive insulating ceramic material (not shown) covers sensor 150 and fills cavity 152. For more information on the sensors and interconnects made in a thin film layer directly deposited on the substrate, please refer to U.S. Pat. No. 6,190,040 B1 to Renken et al., entitled "Apparatus for Sensing Temperature on a Substrate in an Integrated Circuit Fabrication Tool," which is hereby incorporated by this reference in its entirety.

Sensors 150 are necessary for detecting various processing conditions are mounted on or fabricated in substrate 104 according to well known semiconductor transducer design. For measuring temperature, a popular transducer is an RTD or thermistor, which includes a thin-film resistor material having a temperature coefficient. A magneto-resistive material may also be used to measure the amount of magnetic flux exerted upon substrate 104. A resistance-to-voltage converter is often formed within the substrate between distal ends of the resistive-sensitive material (either thermistor or magneto-resistive material). Another exemplary temperature sensor includes a thermocouple made of two dissimilar conductors lithographically formed in the layers of the substrate. When the junction between the conductors is heated, a small thermoelectric voltage is produced which increases approximately linearly with junction temperature. Another example of a temperature sensor includes a diode that produces a voltage that increases with temperature. By connecting the diode between a positive supply and a load resistor, current-to-voltage conversion can be obtained from the load resistor. Another sensor is a piezoelectric device such as a quartz tuning fork fabricated from quartz crystal cut on a crystal orientation which exhibits a temperature dependent frequency of oscillation. The sensor's oscillating frequency can be referenced against a master oscillator formed by a piezoelectric device such as a quartz tuning fork which is fabricated from a crystal orientated to minimize frequency change with temperature. The frequency difference between the sensor and master oscillator would provide a direct digital temperature dependent signal. Piezoelectric sensors may also be used to sense mass change to measure deposition mass and rates or other process conditions.

Sensors 150 may also be used to measure pressure, force or strain at select regions across substrate 104, either as a discrete sensor or a sensor integrally formed in the layers of substrate 104. There are many types of pressure transducers capable of measuring the atmospheric pressure exerted upon the wafer. A suitable pressure transducer includes a diaphragm-type transducer, wherein a diaphragm or elastic element senses pressure and produces a corresponding strain or deflection which can then be read by a bridge circuit connected to the diaphragm or cavity behind the diaphragm. Another suitable pressure transducer may include a piezoresistive material placed within the semiconductor substrate of substrate 104. The piezoresistive material is formed by diffusing doping compounds into the substrate. The resulting piezoresistive material produces output current proportional to the amount of pressure or strain exerted thereupon.

Sensors 150 may also be used to measure flow rate across substrate 104. In addition, humidity and moisture sensors can also be formed upon substrate 104. A well-known method for measuring flow rate, a hot-wire anemometer, may be incorporated into substrate 104. Fluid velocity is based upon the frequency of vortex production as a streamlined fluidic flow strikes a non-streamlined obstacle formed upon substrate 104. Measurement of fluid flow generally involves the formation of special vortices on either side of the obstacle. Thus, an alternating pressure difference occurs between the two sides. Above a threshold (below which no vortex production occurs), the frequency is proportional to fluid velocity. Of many methods of detecting the alternating pressure difference, a hot thermistor is preferably placed in a small channel between the two sides of the obstacle. The alternating directions of flow through the capitalized channel periodically cool the self-heated thermistor thereby producing an AC signal and corresponding electric pulses at twice the vortex frequency. Therefore, an obstacle protruding from substrate 104 in front of a thermistor can provide solid-state flow rate measurement. Heat can be transferred between self heated thermistors placed in close proximity to each other. Fluid flow transfers thermal energy between the adjacent thermistors causing a thermal imbalance proportional to mass flow. Two or more adjacent sensors can be arrayed to measure flow along a vector, or multiple flow vectors may also be sensed. The thermal imbalance can be detected to produce a DC signal related to mass flow. Flows in multiple directions can be compared to detect flow vectors.

Sensors 150 can also be used to measure the gaseous chemical concentration placed upon substrate 104. Chemical composition sensors utilize a membrane which is permeable to specific ions to be measured. Ideally, the membrane should be completely impermeable to all other ions. The conductivity of the membrane is directly proportional to the transport of select ions which have permeated the membrane. Given the variability of membrane conductivity, measurements can be taken which directly correlate to the amount of chemical ions present within the ambient surrounding substrate 104.

Sensors 150 may also be used to measure ion current density and ion current energy with a parallel plate structure, an array of collecting plates, and collecting plates with control grids supported above the collecting plates. The current flowing between parallel plates, or to the array of collecting plates will increase with ion current density. Ion current energy can be detected by applying a constant or varying DC potential on the grids above the plates. This will modulate current flow with ion current energy allowing the energy distribution to be detected. This is useful in monitoring and regulating a deposition or etching process.

A piezoelectric transducer/sensor may also be integrated into substrate 104 to measure the resonant frequency of a layer and thus the mass or thickness of the layer.

Additionally, sensors 150 can also be used to detect a change in position or displacement of an object spaced from substrate 104. Exemplary displacement transducers include electro-optical devices which can measure photon energy (or intensity) and convert photon energy to an electric field or voltage. Relatively well known electro-optical devices include light-emitting diodes, photodiodes, phototransistors, etc., which can be formed upon a semiconductor substrate. Displacement sensors are used to provide accurate information about electrode spacing within an etch or deposition chamber, and can also provide spacing information between a wafer and corresponding masks and/or radiation source.

Figure 2:
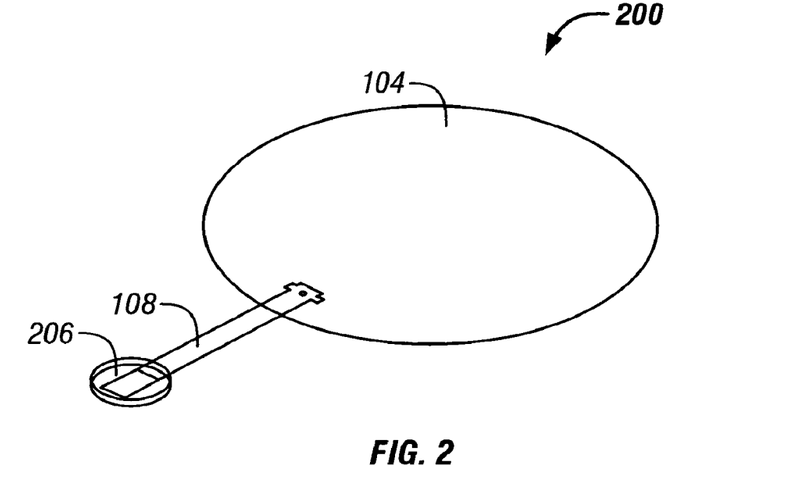
FIG. 2 is a perspective view of PCMD 200, another embodiment of the invention.

FIG. 2 illustrates another embodiment of a process condition measuring device, PCMD 200. PCMD 200 is similar to PCMD 100 except that electronics disc 206 is smaller than electronics disc 106 of PCMD 100 and substrate 104. As in PCMD 100, the electronics disc 206 is separated from substrate 104 in an extended position. PCMD 200 may come together with (above or below) substrate 104 or may always remain extended. Thus the electronics can be distanced from the deleterious conditions of the processing chamber. The electronics may be in a form factor other than a disc.

Figure 3A:
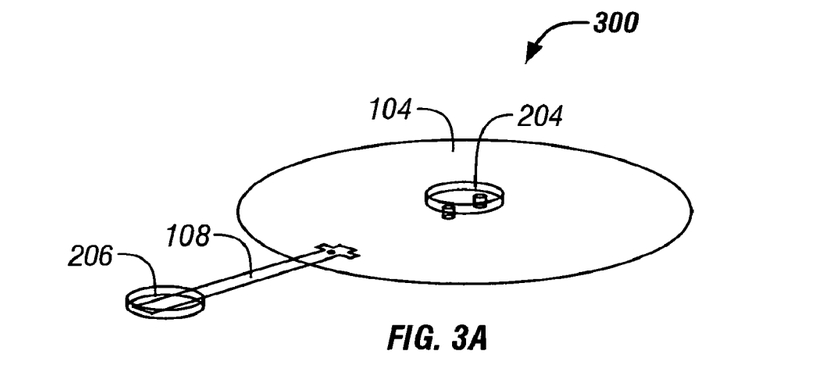
FIG. 3A is a perspective view of PCMD 300, another embodiment of the invention.

FIG. 3A illustrates yet another embodiment of a process condition measuring device, PCMD 300. PCMD 300 is similar to PCMD 200 of FIG. 2 but includes an additional electronics platform 207 upon the surface, into the surface or into a cavity of substrate 104. The electronic and power supply circuitry 151 previously contained in electronics disc 106 and 206 of PCMD 100 and 200 is now divided between electronics disc 206 and electronics platform 207. Any portion of PCMD circuitry 151 shown in FIG. 1F can be at either location and may also be duplicated on each platform. Preferably, signal acquisition circuitry 154 is part of electronics platform 207 and data transmission circuitry 158 is present at both electronics platform 207 and at electronics disc 206. Thus, communication to DPD 110 could be either from electronics platform 207 or electronics disc 206. Electronics platform 207 may be anywhere upon the surface of substrate 104. In this embodiment it is located in the center.

Figure 3B:
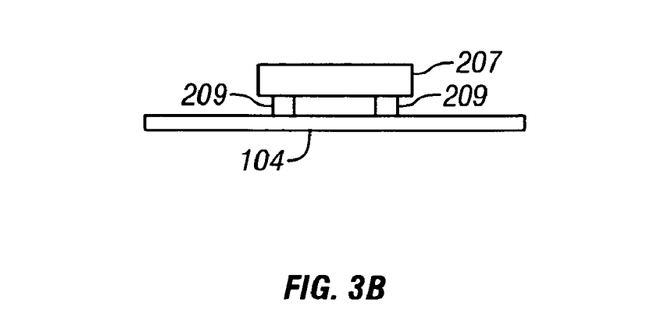
FIG. 3B is a plan view of PCMD 300.

As can be seen in FIG. 3B, electronics platform 207 is elevated from the surface of substrate 104 with one or more spacers or platform legs 209. As mentioned previously, a processing chamber may have rather large gradients in temperature and other parameters. In some cases, the most severe processing condition may be at the level of the wafer. Elevating the electronics from the surface of the wafer is another way of isolating the electronics from the harshest processing conditions. The platform 207 and the platform leg(s) 209 are preferably made from a material with similar/compatible characteristics as substrate 104, but could be made of virtually any material. Compatibility may relate to thermal coefficient of expansion, or other mechanical, electrical, or material properties. The distance that platform 207 is elevated from substrate 104 can be tailored depending on the processing condition anticipated to be measured, but is generally from 1 mm to 5 mm. Platform legs may range in size from 0.05 mm in diameter or width (if not round) to more than 1.0 mm and are preferably of a minimal diameter or width of about 0.05 mm diameter to limit heat transfer between the substrate and platform. Signals from the electronic circuitry of platform 207 are transferred to substrate 104 via either a small electrical cable or conductors integral to platform legs 209.

Figure 4:
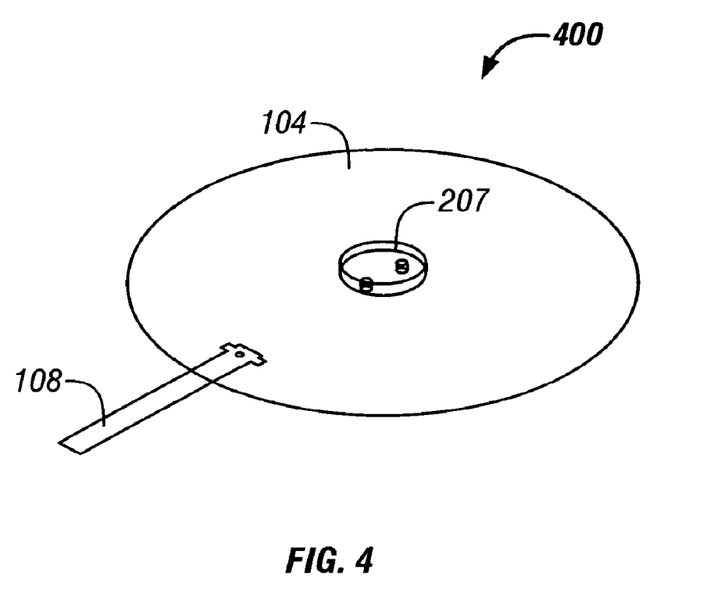
FIG. 4 is a perspective view of PCMD 400, another embodiment of the invention.

FIG. 4 illustrates PCMD 400, another embodiment of the invention. PCMD 400 is similar to PCMD 300 except that it does not include electronics disc 206. Electronics platform 207 includes SAC 154 and DTC 158. Power supply 162 is preferably located on platform 207 but may also be located on substrate 104. Cable 108 may extend outside the process chamber to function as an antenna, or external transducer, to support the transceiver by allowing communications which would be prevented from within the closed process chamber containing substrate 104 and electronics platform 207. Cable 108 would thus act as part of data link 112, in transmitting signals, real time or delayed, between DTC 158 and DPD 110. Alternatively, cable 108 can be connected directly to DPD 110, and thus data link 112 would be a wired link.

Figure 5:
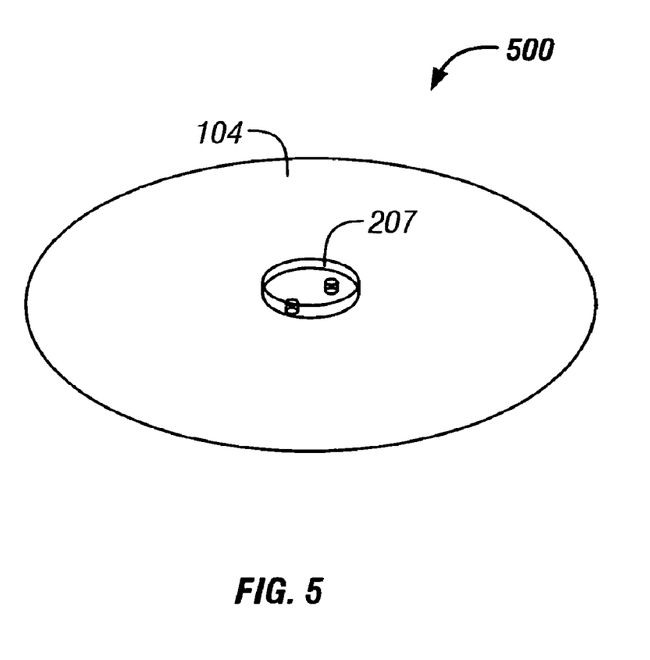
FIG. 5 is a perspective view of PCMD 500, another embodiment of the invention.

FIG. 5 illustrates PCMD 500, yet another embodiment of the invention. PCMD 500 lacks the cable 108 of PCMD 400 but is otherwise similar. Accordingly, PCMD 500 communicates wirelessly over data link 112. An antenna is preferably integrated into electronics platform 207 but may also be formed in or upon substrate 104.

Thus far, in all of the embodiments featuring electronics platform 207, that is, PCMD 300, 400, and 500, the platform has been located in the center of substrate 104. This is because it is important to keep the process condition measuring device properly balanced as it may be spun or rotated by a robot arm. However, thermal balance is also important, as is the balance of many other processing conditions. As mentioned previously, a processing condition may vary greatly throughout the processing chamber. Each different processing condition has its own profile or gradient within the processing chamber. Thus, in order to accommodate these variations it is advantageous to vary the location of electronics platform 207 depending on the processing condition, or to locate more than one platform upon or into the substrate.

Figure 6:
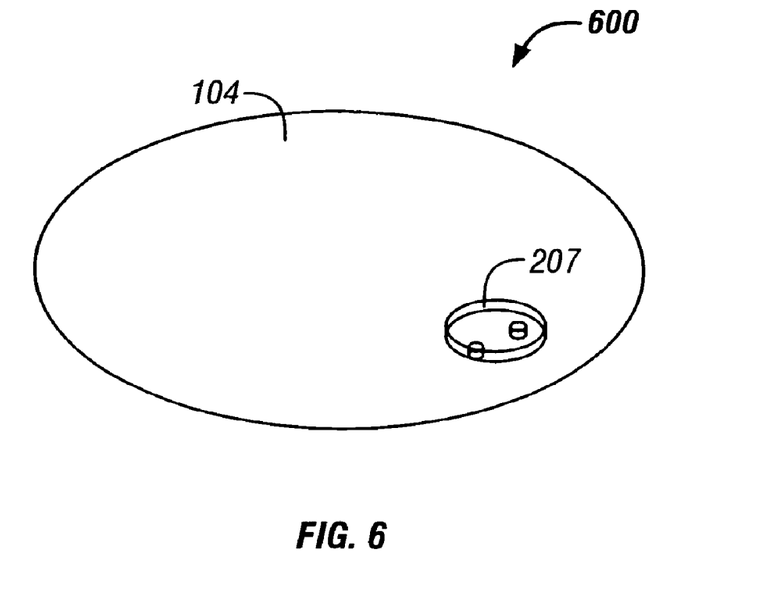
FIG. 6 is a perspective view of PCMD 600, another embodiment of the invention.
Figure 7:
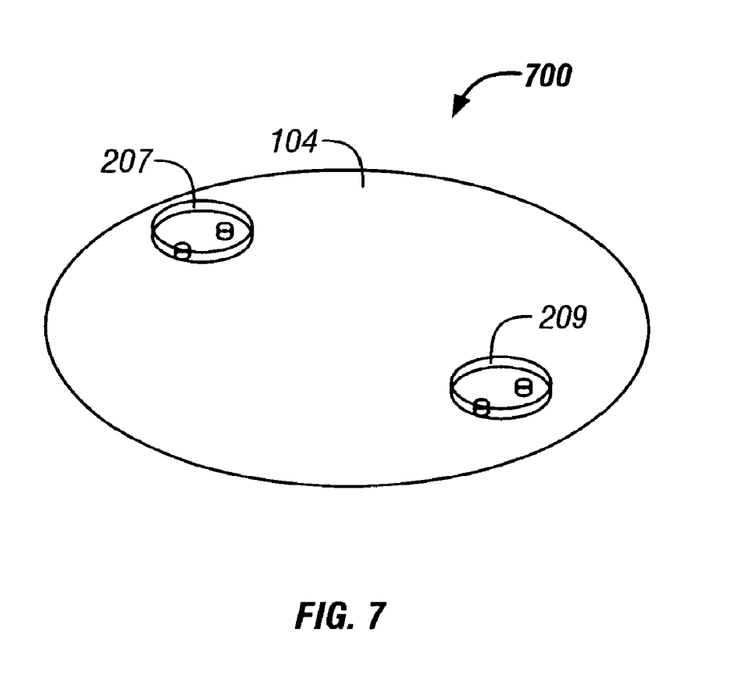
FIG. 7 is a perspective view of PCMD 700, another embodiment of the invention.

In FIG. 6, PCMD 600 has electronics platform 207 located near the edge of substrate 207. Otherwise PCMD 600 is the same as PCMD 500. In FIG. 7, PCMD 700 has two or more electronics platforms 207 and 209 located on a diameter of substrate 104 and equally distanced from the center of substrate 104. PCMD circuitry 151 may be divided in any proportion between electronics platform 207 and 209—including a configuration wherein platform 209 has no electronic components or circuitry. Also, the PCMD circuitry 151 may be duplicated on each platform.

In any embodiment a platform containing all or part of the PCMD circuitry 151, i.e., memory 152, SAC 154, DTC 158, and power supply 162 may be alternatively integrated into the substrate or contained within a cavity formed within the substrate. This is done so that the substrate 104 used to measure the processing conditions has substantially the same mass as a production substrate subject to the processing conditions of actual production. The objective is to remove the same mass of substrate as added by the platform in order to accurately simulate the effects on as similar a test substrate (104) as possible. Dynamic thermal response times to temperature changes can be most accurately measured if the mass and thermal conduction within substrate 104 is similar to the product substrate.

While particular embodiments of the present invention and their advantages have been shown and described, it should be understood that various changes, substitutions, and alterations can be made therein without departing from the spirit and scope of the invention as defined by the appended claims. For example, the location and type of the sensors may be different than in the examples described. Additionally, the electronics platform or disc may be recessed into the a cavity of the measuring substrate, and circuitry that performs the same function in the same way to get the same result is also within the scope of the invention.

The invention claimed is:

1. A device for monitoring processing conditions to be inserted by a robot hand into a sealed chamber, the device comprising: a first member comprising sensors; a second member comprising electronics; a conductive cable or conductors connecting the first and second members, wherein the first and second members fit into or onto a robot hand or hands, and wherein the device can be extended to a second position by the robot hand such that the first member is inside the sealed chamber and the second circular member is outside the chamber, thereby not subjecting the electronics of the second member to the conditions within the chamber.

2. The device of claim 1 wherein in the second position the cable of the device is sealed at a door of the chamber.

3. The device of claim 1 wherein the device further comprises a data processing computer coupled to the second circular member.

4. The device of claim 1 wherein the first and second members are circular or rectangular.

5. The device of claim 1 wherein the electronics comprise a power supply, and an amplifier.

6. The device of claim 5 wherein the electronics further comprise a transceiver for communicating to a data processing device.

7. The device of claim 5 wherein the electronics further comprise an analog-to-digital converter.

8. The device of claim 1 wherein the first member includes an instrumented substrate having a sensor that output sensor signal data.

9. The device of claim 8 wherein the instrumented substrate has a physical dimension that is equal to the physical dimension of a semiconductor wafer, printed circuit board or flat panel display substrate and the electronics module has a physical dimension that is equal to or less than the physical dimension of the instrumented substrate.

10. The device of claim 8 wherein the instrumented substrate is placed in a process environment and the electronics module is placed outside the process environment.

11. The device of claim 8 wherein the second member includes an electronics module configured to receive the sensor signal data from the instrumented substrate and pass the sensor signal data to a data processing system a data processing system that processes the sensor signal data that is output by the sensor.

12. The device of claim 11 wherein the conductive cable or conductors include a physically continuous flexible connection between the electronics module and the instrumented substrate, the connection allowing relative movement of the electronics module with respect to the instrumented substrate.

13. The device of claim 11 wherein the electronics module has a memory unit configured to store the sensor signal data prior to the electronics module passing the sensor signal data to the data processing system.

14. The device of claim 11 wherein the electronics module is configured to pass the sensor signal data pass from the electronics module to the data processing module over a wireless connection.

15. The device of claim 11 wherein the electronics module includes a data processing device having a processing unit and/or memory.

* * * * *